(12) United States Patent
Jain

(10) Patent No.: US 11,764,662 B2
(45) Date of Patent: *Sep. 19, 2023

(54) CONTROL CIRCUITRY FOR INCREASING POWER OUTPUT IN QUASI-RESONANT CONVERTERS

(71) Applicant: STMicroelectronics International N.V., Geneva (CH)

(72) Inventor: Akshat Jain, Nahan (IN)

(73) Assignee: STMicroelectronics International N.V., Geneva (CH)

(*) Notice: Subject to any disclaimer, the term of this patent is extended or adjusted under 35 U.S.C. 154(b) by 466 days.

This patent is subject to a terminal disclaimer.

(21) Appl. No.: 16/984,756

(22) Filed: Aug. 4, 2020

(65) Prior Publication Data

US 2020/0366190 A1 Nov. 19, 2020

Related U.S. Application Data

(63) Continuation of application No. 16/003,331, filed on Jun. 8, 2018, now Pat. No. 10,778,082.

(51) Int. Cl.
*H05B 6/10* (2006.01)
*H05B 6/06* (2006.01)
(Continued)

(52) U.S. Cl.
CPC .............. *H02M 1/08* (2013.01); *H02M 1/32* (2013.01); *H03K 17/0828* (2013.01); *H05B 6/108* (2013.01); *H02M 7/04* (2013.01)

(58) Field of Classification Search
CPC ............ H02M 1/08; H02M 1/32; H02M 7/04; H02M 7/4815; H03K 17/0828; H03K 2217/009; H05B 6/06; H05B 6/108; Y02B 70/10; Y02P 80/10
USPC ........ 219/620, 628, 660, 665, 661, 663, 664, 219/668; 363/50, 56, 57, 58, 89, 136, 363/125–127, 173, 56.01, 56.02, 56.03, 363/56.04, 56.05; 361/93.9, 56, 18, 91.1, 361/48, 90, 97, 115; 323/222, 224, 276, 323/282, 315, 908
See application file for complete search history.

(56) References Cited

U.S. PATENT DOCUMENTS 5,251,120 A * 10/1993 Smith .................. H03H 7/0115
363/44
6,269,011 B1 7/2001 Ohshima
(Continued)

*Primary Examiner* — Quang T Van
(74) *Attorney, Agent, or Firm* — CROWE & DUNLEVY

(57) ABSTRACT

A circuit includes a transistor, with a resonant tank coupled between a DC supply node and a first conduction terminal of the transistor. A gate driver generates a gate drive signal for biasing a control terminal of the transistor to cause it to conduct current through the resonant tank. Control circuitry monitors a voltage across the transistor to determine that the transistor is an overvoltage condition if that voltage exceeds a threshold, and monitors a current through the transistor to determine that the transistor is an overcurrent condition if that current exceeds a threshold. If overvoltage is determined, the control circuitry causes the gate driver to pull up the gate drive signal. If overcurrent is determined, the control circuitry causes the gate driver to pull down the gate drive signal. If either overvoltage or overcurrent is present, a pulse width of the gate drive signal is reduced.

32 Claims, 6 Drawing Sheets

(51) Int. Cl.
*H02M 1/08* (2006.01)
*H02M 1/32* (2007.01)
*H03K 17/082* (2006.01)
*H02M 7/04* (2006.01)

(56) References Cited

U.S. PATENT DOCUMENTS

| | | |
|---|---|---|
| 9,331,474 B1 | 5/2016 | Mallik et al. |
| 10,778,082 B2 * | 9/2020 | Jain .................. H02M 1/32 |
| 2013/0277362 A1 | 10/2013 | Ribarich et al. |

* cited by examiner

CONTROL CIRCUITRY FOR INCREASING POWER OUTPUT IN QUASI-RESONANT CONVERTERS

RELATED APPLICATION

This is a continuation of U.S. patent application Ser. No. 16/003,331, filed Jun. 8, 2018, the contents of which are incorporated by reference in their entirety to the maximum extent allowable under the law.

TECHNICAL FIELD

This disclosure is related to control circuitry for transistors in quasi-resonant converters, such as may be used in the design of induction geysers.

BACKGROUND

According to Faraday's law of induction, when an alternating current (AC) flows through a conductor, that alternating current creates a magnetic field around the conductor due its periodically changing direction. If another conductor, which can be referred to as a secondary conductor, is placed in the vicinity of this magnetic field, current is induced in the secondary conductor. This current is also alternating in nature. Due to the electrical resistance of the secondary conductor to the flow of current, some amount of energy is dissipated as heat. This heat can be harvested for a variety of uses, such as in the well-known induction stove top.

In an induction stove top, the induction stove top itself contains a resonant coil through which alternating current flows when the induction stove top is activated. Cookware made from a ferromagnetic material, such as stainless steel or iron, is placed on the induction stove top.

This system of the resonant coil and cookware can be considered as a transformer in which the cookware acts as a shorted secondary (load). As stated, alternating current flows through the resonant coil when the induction stove top is activated, which results in the generation of an oscillating magnetic field. This oscillating magnetic field induces electric currents inside the cookware, which results in heating of the cookware due to the electrical resistance of the cookware. The purpose of the cookware being constructed from ferromagnetic material is so that high eddy currents in the cookware are produced in the presence of the oscillating magnetic field, resulting in high energy dissipation, and thus, sufficient heating of the cookware.

Induction geysers (water heaters) represent a new application for the use of induction heating. An induction geyser includes a resonant tank through which rectified power from an AC power source flows, and a fluid tank containing water. The fluid tank is constructed from ferromagnetic material.

When alternating current flows through the resonant tank, when operated in a quasi-resonant mode, eddy currents are induced in the ferromagnetic material of the fluid tank, resulting in the fluid tank heating up, which in turn heats the water.

Using inductive heating as opposed to well-known resistive heating brings a variety of advantages. For example, with resistive heating, the power rating is necessarily dependent on the AC voltage it receives, which may be inconsistent. In addition, for a water heater, resistive heating typically uses a resistive heating element within a fluid tank, and hard water can form white scaling around the resistive heating element, causing degradation in ability to heat the water effectively. Since the heating element in an induction geyser is the ferromagnetic material of the fluid tank itself, this issue is not present. Moreover, since the heating element of the induction geyser is the ferromagnetic material in the fluid tank, the induction geyser is capable of more rapid heating than a water heater relying on resistive heating, as the heating element of the induction geyser has a greater surface area.

This makes induction geysers particularly useful for energy conscious applications, such as developing areas, and for applications where quick heating of water is desired, such as vacation homes in which a water heater will typically only be turned on once the vacationers have arrived.

A known technique for driving the resonant tank of a quasi-resonant induction converter in an induction geyser is to use a low-side drive transistor coupled to pull current from a rectifier 6 through the resonant tank 8. An example of such a circuit 1 is shown in FIG. 1, in which a pulse width modulation (PWM) generator 2 generates a PWM control signal 3 that is applied to a gate driver 4, which generates a gate drive signal 5 that is applied to the gate of an insulated gate bipolar transistor (IGBT) TO. A rectifier 6 rectifies AC power from an AC Mains line. The IGBT transistor TO has its collector coupled to the resonant tank and its emitter coupled to ground, and serves to pull current from the rectifier 6 through the resonant tank 8.

Although the circuit 1 of FIG. 1 allows for the realization of an induction geyser, such induction geysers are not tuned to deliver maximum power to their fluid tanks, so that they require a longer period of time to heat their water than would be possible with maximum power delivery. This lack of tuning to deliver maximum power to the fluid tank is done for a variety of reasons.

For example, in developing countries, the voltage of the AC power source (e.g. AC Mains) may be inconsistent. In addition, process and material variation in realizing the resonant tank and fluid tank may result in less than optimal eddy current generation. Moreover, magnetic coupling between the resonant tank and the fluid tank may be inconsistent. In addition, this existing solution lacks a comprehensive safety mechanism to protect the IGBT. Therefore, for all these reasons the IGBT is operated so as to maintain high safety margins, and the converter is thus operated at a low power, resulting in the longer period of time to heat water. Also, the protections to the IGBT provided by the existing solution are not foolproof.

It would be desirable to maximize, or come close to maximizing, power output of the converter while properly protecting the IGBT. Therefore, the development of further control circuitry for quasi-resonant converters used in induction geysers and in other applications is necessary.

SUMMARY

Disclosed herein is a circuit, including: a DC supply node; a transistor having a first conduction terminal, a second conduction terminal, and a control terminal; a resonant tank coupled between the DC supply node and the first conduction terminal of the transistor; a gate driver configured to generate a gate drive signal for biasing the control terminal to cause the transistor to conduct current through the resonant tank, the gate drive signal formed of a series of pulses having a first pulse width. Control circuitry is configured to: monitor a voltage between the first and second conduction terminals of the transistor to determine that the transistor is an overvoltage condition when the voltage between the first and second conduction terminals exceeds a threshold voltage; in response to an overvoltage determination, cause the gate driver pull up the gate drive signal; and in response to an overvoltage determination, cause modification of the gate drive signal by the gate driver such that the series of pulses have a second pulse width instead of the first pulse width.

Also disclosed herein is a circuit, including: a DC supply node; a transistor having a first conduction terminal, a second conduction terminal, and a control terminal; a resonant tank coupled between the DC supply node and the first conduction terminal of the transistor; and a gate driver configured to generate a gate drive signal for biasing the control terminal to cause the transistor to conduct current through the resonant tank, the gate drive signal formed of a series of pulses having a first pulse width. Control circuitry is configured to: monitor a current flowing between the first and second conduction terminals of the transistor to determine that the transistor is in an overcurrent condition when the current flowing between the first and second conduction terminals exceeds a threshold current; in response to an overcurrent determination, cause the gate driver to pull down the gate drive signal; and in response to an overcurrent determination, cause modification of the gate drive signal by the gate driver such that the series of pulses have a second pulse width instead of the first pulse width.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein.

Figure 1:
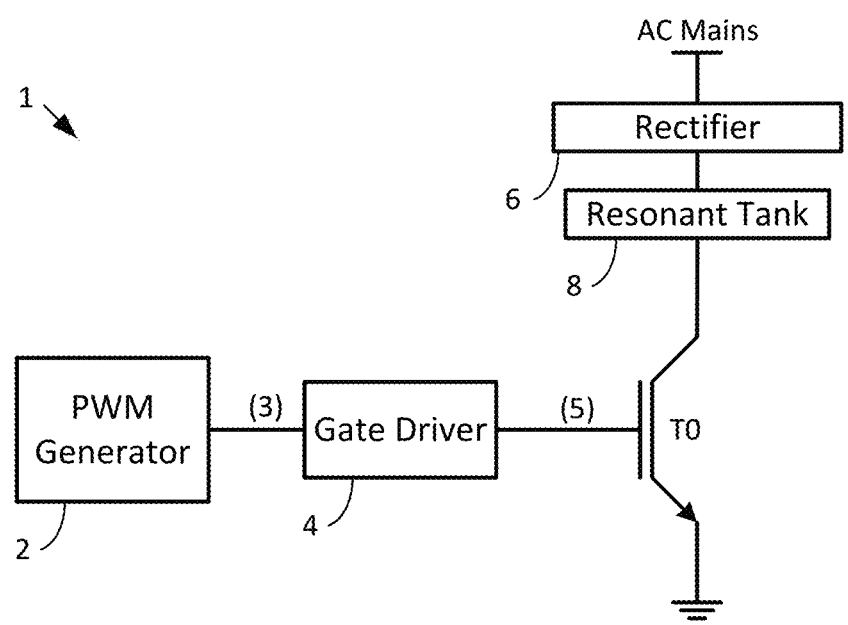
FIG. 1 is a block diagram of a quasi-resonant converter circuit known in the prior art.
Figure 2:
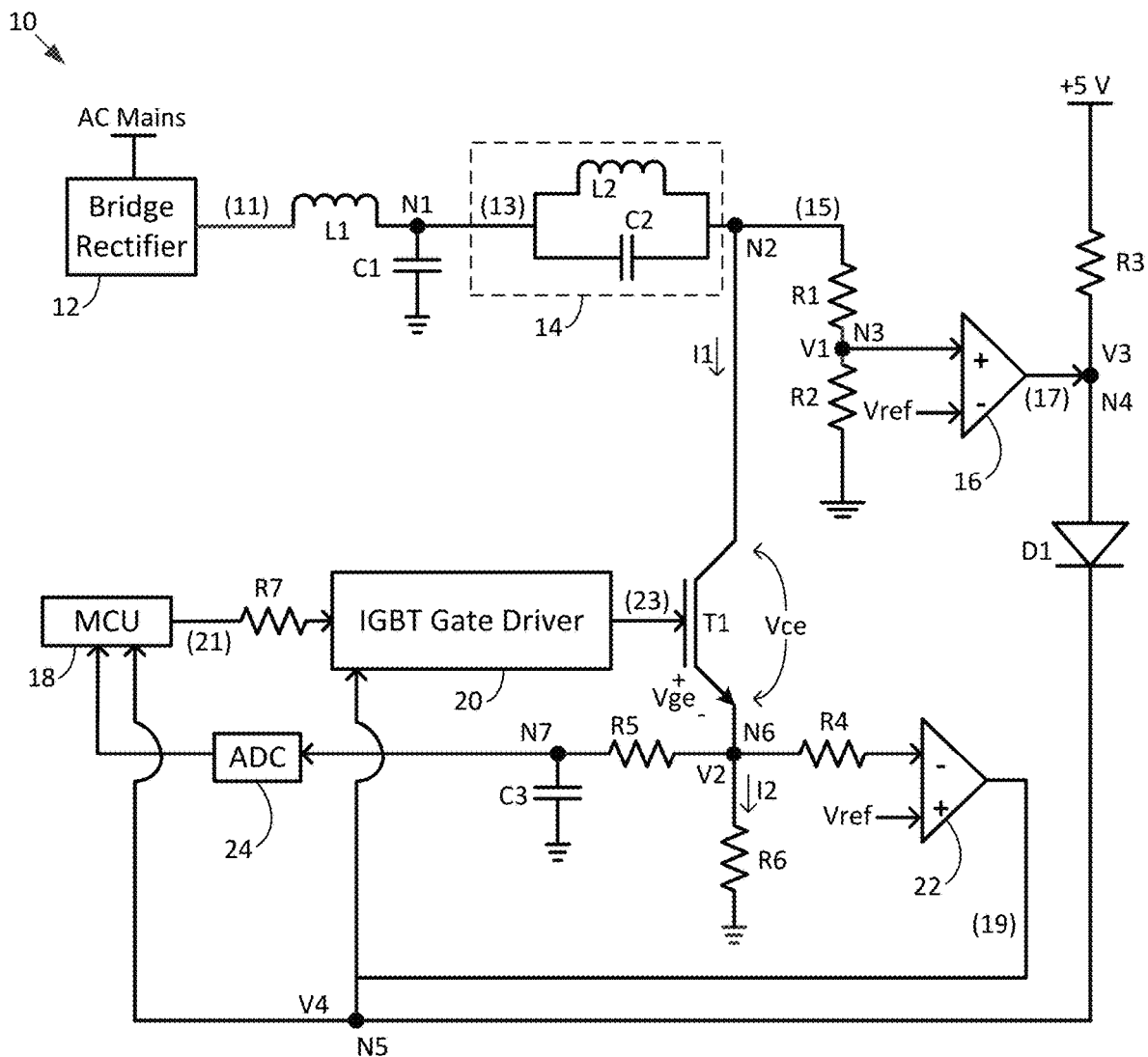
FIG. 2 is a block diagram of a quasi-resonant converter circuit in accordance with this disclosure, such as may be used in an induction geyser.

With reference to FIG. 2, a quasi-resonant converter circuit 10 for controlling an insulated-gate bipolar transistor IGBT T1 is now described. The quasi-resonant converter circuit 10, broadly speaking, functions so as to control the IGBT T1 in such a way that the output from the quasi-resonant converter circuit 10 is maximized, regardless of variations in input voltage, load material, or variations in coupling.

The quasi-resonant converter circuit 10 includes a bridge rectifier 12 that rectifies power from an AC mains line and outputs a rectified power signal 11 to an LC filter formed by inductor L1 coupled in series between the bridge rectifier 12 and note N1, and a capacitor C1 coupled between node N1 and ground. A resonant tank 14 is coupled between nodes N1 and N2, and is comprised of inductor L2 coupled in parallel with capacitor C2. The IGBT T1, described in greater detail below, has its collector coupled to pull current I1 through the resonant tank 14.

A resistive divider comprised of resistors R1 and R2 coupled in series at center tap N3 is coupled between node N2 and ground. A comparator 16 capable of high speed operations has its non-inverting terminal coupled to node N3 and its inverting terminal coupled to reference signal Vref, and provides its output to node N4. The comparator 16 serves to compare the voltage V1 at node N3, which is proportional to the voltage Vce between the collector and emitter of the IGBT T1, to the reference voltage Vref, and its output 17 indicates whether the voltage V1 is greater than the reference voltage Vref, and serves to turn on the IGBT T1 to provide overvoltage protection.

A resistor R3 is coupled between a direct current (DC) voltage (here 5 V) and node N4, while a diode D1 is coupled between node N4 and node N5. A microcontroller (MCU) 18 has an input that is coupled to diode D1 at node N5. The functions of the MCU 18 will be described in detail below.

The emitter of the IGBT T1 is coupled to node N6, while its gate is coupled to receive a gate drive signal 23 output from an IGBT gate driver 20. The MCU 18 generates a pulse width modulation (PWM) control signal 21 for the IGBT gate driver 20, and passes it to the IGBT gate driver 20 through resistor R7, which is coupled to the IGBT gate driver 20 at node N5. The IGBT gate driver 20 generates a gate drive signal 23 that is based upon the PWM control signal 21.

A resistor R6 is coupled between the emitter of the IGBT T1 at node N6 and ground. A comparator 22 capable of high speed operation has its inverting terminal coupled to node N6 through resistor R4, its non-inverting terminal coupled to the reference voltage Vref, and provides its output to node N5. The comparator 22 compares the voltage V2 at node N6 (which is proportional to current I1) to the reference voltage, and its output 19 indicates whether the voltage V2 is greater than the reference voltage Vref, and serves to cause the IGBT gate driver 20 pull down the gate drive signal 23 to provide for overcurrent protection.

A resistor R5 is coupled between nodes N6 and N7. A capacitor C3 is coupled between node N7 and ground. An analog to digital converter (ADC) 24 receives input from node N7, and digitizes its input as output to the MCU 18. Although the ADC 24 is shown as being external to the MCU 18, it may also be an internal component of the MCU. A resistor R7 is coupled between the output of the MCU 18 and node N5.

Operation of the quasi-resonant converter circuit 10 will now be described in detail with additional reference to the timing diagrams of FIGS. 3-5.

In operation, the MCU 18 generates a PWM control signal 21 for the IGBT gate driver 20, which in turn generates a gate drive signal 23 to the gate of the IGBT T1. This gate drive signal 23 is generated with a gradual increase in duration until it is asserted, providing for a "soft" start. Along with the gradual rise in duration of the gate drive signal 23, the MCU 18 monitors the current I1 flowing across the IGBT T1 by monitoring the voltage V2 as seen from the input of the ADC 24. Regardless of the voltage of the AC mains (provided that it is within the range of 85 V to 300 V), the MCU 18 will generate the PWM control signal 21 so as to control the gate drive signal 23 to rise in duration until either an overvoltage or an overcurrent situation is reached by the IGBT T1.

It is noted that an overvoltage or overcurrent condition can result from transients in the voltage received from the AC Mains, or simply due to the optimal duty cycle for the IGBT T1 being reached. An overvoltage situation means that the voltage between the collector and emitter of the IGBT T1, Vce, has exceeded a set limit. As will be explained, in the presence of an overvoltage situation, the comparator 16 serves as a self-clamp and causes the IGBT gate driver 20 to generate the gate drive signal 23 at a high voltage so as to turn on the IGBT T1 to bring the voltage Vce across the IGBT T1 to a safe level. In parallel, the MCU 18 reads the output of comparator 17 as an interrupt, and will generate the PWM control signal 21 so that upcoming pulses of the gate drive signal 23 are reduced in pulse width.

An overcurrent situation means that the current I1 flowing between the collector and emitter of the IGBT T1 has exceeded a set limit. As will be explained, in the presence of an overcurrent situation, the comparator 22 causes the IGBT gate driver 20 to generate the gate drive signal 23 at a logic low so as to turn off the IGBT T1 to bring the current I1 through the IGBT T1 to a safe level. In parallel, the MCU 18 reads the current I1 flowing between the collector and emitter of the IGBT T1 at the ADC 24 by measuring the voltage across the resistor R6, and generates the PWM control signal 21 so that upcoming pulses of the gate drive signal 23 are reduced in pulse width if the reading at the ADC 24 is consistently above the set limit.

Figure 3:
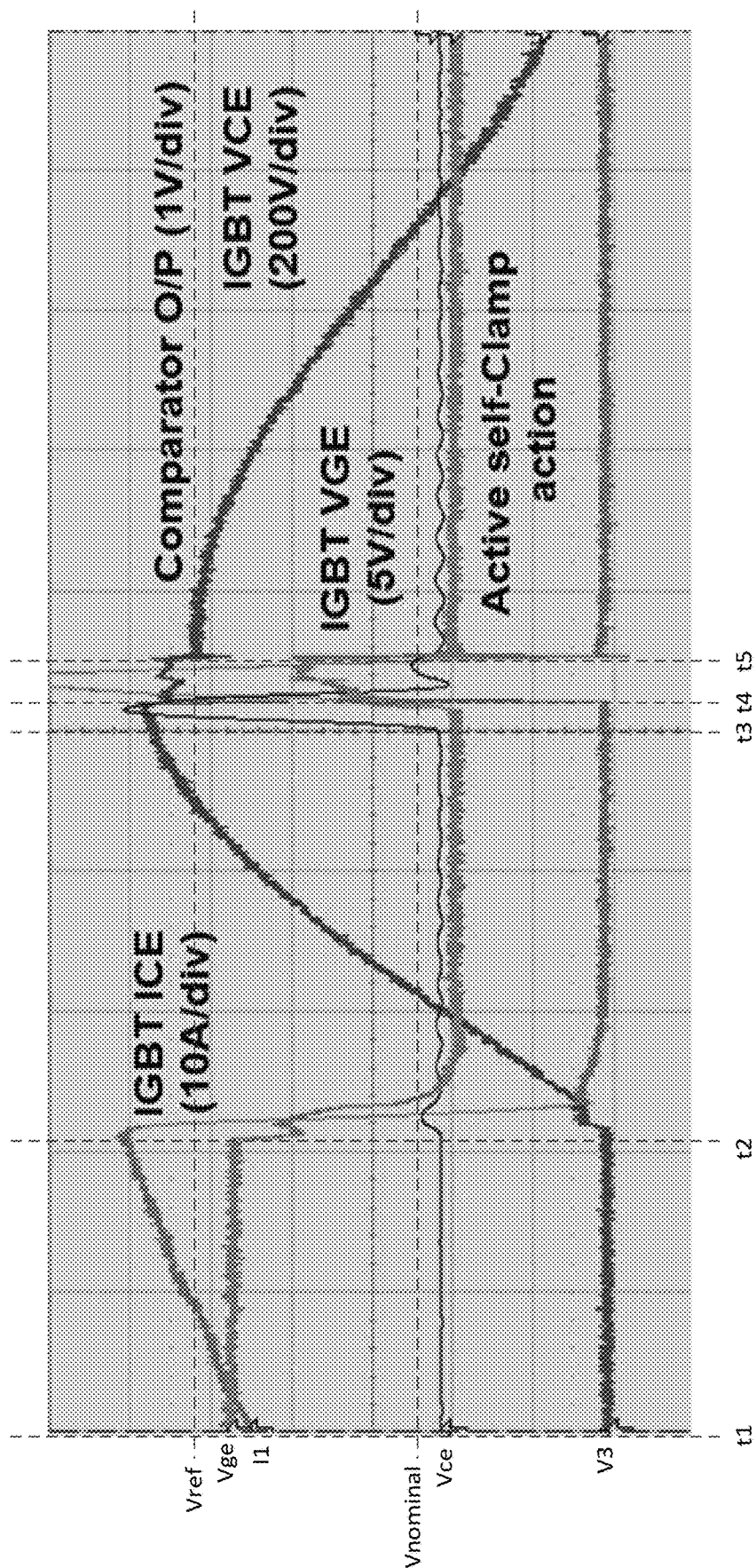
FIG. 3 is a timing diagram showing the operation of the quasi-resonant circuit of FIG. 2 when checking for, and protecting against, overvoltage scenarios.

Referring to FIG. 3, between time periods t1 and t2, operation without reaching of an overvoltage condition is shown. Between time periods t1 and t2, the current I1 ramps up when the IGBT T1 turns on, until at time t2, the gate drive signal 23 is deasserted, resulting in the IGBT T1 turning off, the voltage Vge between the gate and emitter of the IGBT T1 falling, and in the voltage Vce between the current and emitter of the IGBT T1 rising to a nominal level Vnominal in accordance with the resonance characteristics of the resonant tank 14. After time t2, the voltage Vce increases in accordance with the resonance characteristics of the resonant tank to time t3.

If Vce exceeds the set limit Vref, as it does between time t3 and t4, then the self-clamping action performed by the comparator 16 turns the IGBT T1 on for a short span of time between t4 and t5 to bring Vce to or below Vref. In parallel, an interrupt is generated to the MCU 18, which works to alter the PWM control signal 21 so that the gate drive signal 23 decreases in pulse duration for a fixed interval of time (e.g. 45 seconds), and then returns to generating the PWM control signal 21 so that the pulse duration of the gate drive signal 23 returns to its original duration. If the overvoltage condition is repeatedly detected after multiple intervals (e.g. if the interrupt is repeatedly received), then the decreased pulse duration for the gate drive signal 23 is maintained until there is a further change in Vce.

This operation can be seen in detail starting at time t2 in FIG. 3. Here, when current I1 ramps down at time t2, the voltage V1 begins to ramp up accordingly, resulting in the voltage V3 produced by output from the comparator 16 ramping up to exceed the reference voltage Vref, indicating that the voltage Vce has exceeded a limit and that the IGBT T1 is now in an overvoltage condition. When the voltage V3 exceeds the reference voltage Vref at time t3, the diode D1 permits current to flow, resulting in the voltage V4 (which is based on the voltage V3) becoming sufficient for the MCU 18 to interpret as an interrupt and for the IGBT gate driver 20 to interpret as an asserted signal.

The IGBT gate driver 20, upon receiving the asserted signal, turns on the IGBT T1 at time t4, resulting in the voltage Vge rising and Vce quickly falling. This results in the voltage Vce falling to approximately the nominal level Vnominal at time t5, curing the overvoltage condition of the IGBT T1. Vge quickly begins to ramp down again at time t5, when the gate drive signal 23 deasserted. As explained, in response to the interrupt, the MCU 18 will alter the PWM control signal 21 such that the next pulse of the gate drive signal 23 produced by the IGBT gate driver 20 has a reduced pulse duration.

Due to the above operation, it should be appreciated that by changing Vref, the limit for Vce can be altered.

Detection of overcurrent is now described with reference to FIG. 4. Here, when the current I1 through the IGBT T1 exceeds a set limit, the output of the comparator 22 causes the IGBT gate driver 20 to immediately shut off the IGBT T1. In parallel, when the MCU 18 detects that the current I1 through the IGBT T1 has exceeded a set limit (performed by the ADC 24 reading the voltage across the resistor R6), the MCU 18 works to alter the PWM control signal 21 so that for the next pulse of the gate drive signal 23, the gate drive signal 23 decreases in pulse duration for a fixed interval of time, and then returns to generating the PWM control signal 21 so that the pulse duration of the gate drive signal 23 returns to its original duration. If the overcurrent condition is repeatedly detected after multiple intervals then the decreased pulse duration for the gate drive signal 23 is maintained until there is a change in I1.

Figure 4:
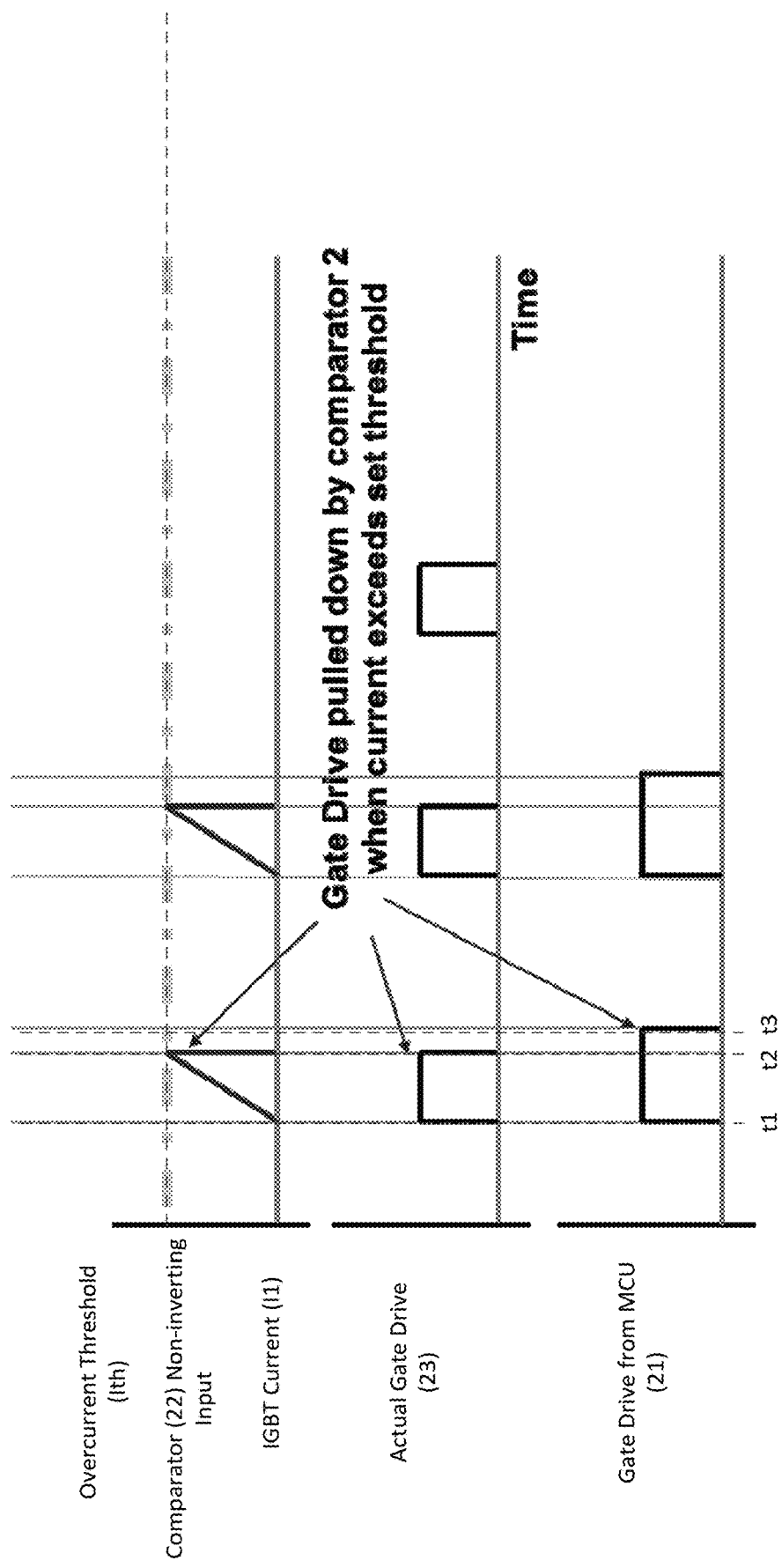
FIG. 4 is a timing diagram showing the operation of the quasi-resonant circuit of FIG. 2 when checking for, and protecting against, overcurrent scenarios.
Figure 5:
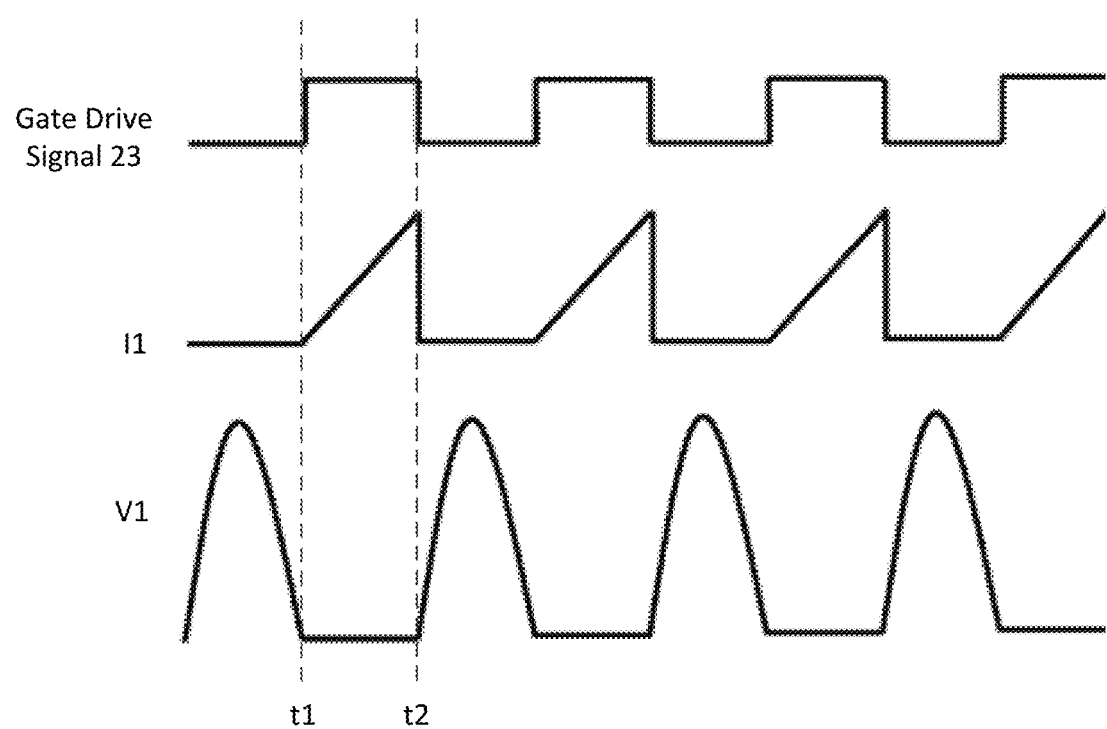
FIG. 5 is a timing diagram showing the operation of the quasi-resonant converter circuit of FIG. 2 in optimal conditions and in an absence of overvoltage or overcurrent scenarios.

This operation can be seen in detail in FIG. 4. When the MCU 18 asserts the PWM control signal 21 at time t1, the IGBT gate driver 20 in turn asserts the gate drive signal 23, turning on the IGBT T1, which pulls current from the bridge rectifier 12, through the resonant tank 14, and into its collector as current I1. Resultingly, at time t1, the current I1 ramps up. As stated, the voltage V2, resulting from current I2 flowing through resistor R6, is proportional to the current I1. Thus, the comparator 22, when voltage V2 exceeds the reference threshold to indicate that the current I1 has exceeded a threshold current Ith and that the IGBT T1 is in an overcurrent condition, deasserts its output 19 to cause the IGBT gate driver 20 pull down the pulse of the gate drive signal 23 at time t2 to thereby shut off the IGBT T1, resulting in the current I1 ramping down below Ith as shown, curing the overcurrent condition.

In addition, the MCU 18 also receives a digital representation of the voltage V2 (representing the current I2, which is proportional to I1, across the resistor R6) from the ADC 24. The MCU 18 measures the voltage V2 multiple times and averages the voltage V2. If the averaged voltage indicates that the current I1 flowing through the IGBT T1 is above the set limit, the MCU 18 acts to reduce the pulse duration of the PWM control signal 21 such that the pulse duration of the gate drive signal 23 is subsequently reduced. It is noted that between time t2 and t3, the PWM control signal 21 continues to be asserted, yet due to the deassertion received by the IGBT gate driver 20 at time t2, the gate drive signal 23 does not remain asserted.

The MCU 18 maintains this reduced pulse duration of the PWM control signal 21 (and accordingly that of the gate drive signal 23) for a given period of time (e.g. 45 seconds) before reverting to the original pulse duration. If the digital representation of the voltage V2 from the ADC 24 is regularly greater than the reference threshold, then the MCU 18 may maintain the reduced pulse duration of the PWM control signal 21 unless and until there is a change in the current through the IGBT T1 such that it is below its set limit.

Through the overvoltage and overcurrent protection functionality described above, the quasi-resonant converter circuit 10 is free to attempt to have the MCU 18 to produce the PWM control signal 21 with a pulse width that will result in the IGBT T1 reaching its maximum power output, without concern for the variation of conditions such as the voltage of the AC Mains, the load material, or variations in the magnetic coupling, as the IGBT T1 will be protected against overvoltage and overcurrent conditions.

Operation in the absence of an overvoltage or overcurrent scenario (and thus when operation has been optimized as described above) will be described with specific reference to FIG. 5. As can be seen, in operation, the MCU 18 generates a PWM control signal 21 for the IGBT gate driver 20, which in turn generates a gate drive signal 23 to the gate of the IGBT T1. When the gate drive signal 23 is asserted at time t1, the IGBT T1 turns on, pulling current from the bridge rectifier 12, through the resonant tank 14, and into its collector as current I1, as shown. The current I1 ramps up as it is pulled into the resonant tank 14 until the gate drive signal 23 is deasserted at time t2, resulting in the IGBT T1 turning off. At that point, the voltage across the collector to emitter Vce of the IGBT T1 rises and then falls to its nominal value, in accordance with the resonance characteristics of the resonant tank 14.

Figure 6:
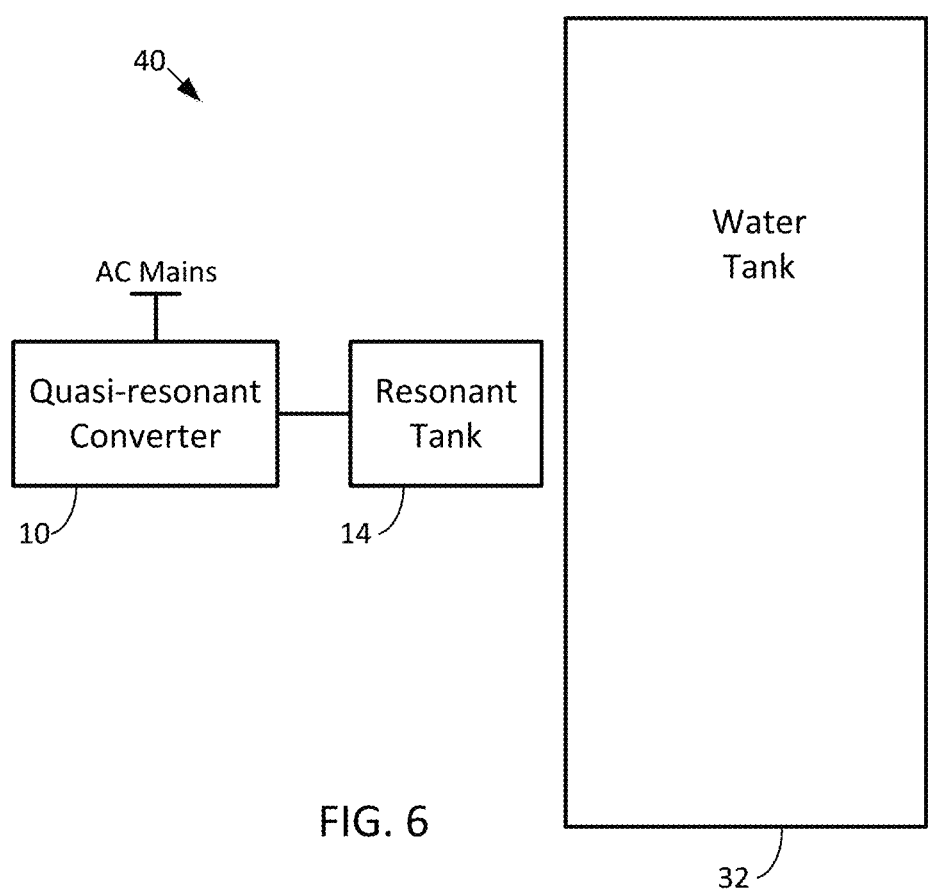
FIG. 6 is a block diagram showing an induction geyser utilizing the quasi-resonant circuit of FIG. 2, in accordance with this disclosure.

An induction geyser 40, such as a water heater system, incorporating a quasi-resonant converter circuit 10 and resonant tank 14, as described above, is now described with reference to FIG. 6. The induction geyser 40 includes a water tank 32, which acts as the secondary conductor. The quasi-resonant converter circuit 10 is coupled to pull current through the resonant tank 14 as described above, with the overvoltage and overcurrent protections as described above. The resonant tank 14 acts as a primary of a transformer, inducing eddy currents in the water tank 32. Most of the energy of the eddy currents are dissipated as heat due to the resistance of the water tank 32, heating the water in the water tank 32.

This particular induction geyser design is particularly suited to use in developing countries, or locales with unreliable and/or inconsistent power, as it allows maximum efficiency without fear of damage to the IGBT within the quasi-resonant converter circuit due to overvoltage or overcurrent conditions.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A circuit, comprising:
    a direct current (DC) supply node;
    a transistor having a first conduction terminal, a second conduction terminal, and a control terminal;
    a resonant tank coupled between the DC supply node and the first conduction terminal of the transistor;
    a gate driver configured to generate a gate drive signal that biases the control terminal to cause the transistor to conduct current through the resonant tank, the gate drive signal comprised of a series of pulses having a first pulse width; and
    control circuitry configured to:
        monitor a voltage between the first and second conduction terminals of the transistor to determine that the transistor is an overvoltage condition when the voltage between the first and second conduction terminals exceeds a threshold voltage;
        in response to the overvoltage condition, cause the gate driver pull up the gate drive signal until an end of the overvoltage condition; and
        in response to the overvoltage condition, cause modification of the gate drive signal by the gate driver such that subsequent pulses of the series of pulses have a second pulse width instead of the first pulse width.

2. The circuit of claim 1, wherein the control circuitry, when causing modification of the gate drive signal, causes modification of the gate drive signal such that the subsequent pulses of the series of pulses have the second pulse width instead of the first pulse width for a given period of time and then revert to the first pulse width unless the overvoltage condition is determined within the given period of time, with the second pulse width being less than the first pulse width.

3. The circuit of claim 1, wherein the control circuitry monitors the voltage between the first and second conduction terminals of the transistor using a first comparator that compares a first voltage proportional to the voltage between the first and second conduction terminals of the transistor to the threshold voltage, and asserts an output of the first comparator if the first voltage is more than the threshold voltage.

4. The circuit of claim 3, wherein further comprising a voltage divider coupled between the first conduction terminal of the transistor and ground; and wherein the first voltage is produced at a tap of the voltage divider.

5. A circuit, comprising:
    a direct current (DC) supply node;
    a transistor having a first conduction terminal, a second conduction terminal, and a control terminal;
    a resonant tank coupled between the DC supply node and the first conduction terminal of the transistor;
    a gate driver configured to generate a gate drive signal that biases the control terminal to cause the transistor to conduct current through the resonant tank, the gate drive signal comprised of a series of pulses having a first pulse width; and
    control circuitry configured to:
        monitor a current flowing between the first and second conduction terminals of the transistor to determine that the transistor is in an overcurrent condition when the current flowing between the first and second conduction terminals exceeds a threshold current;
        in response to the overcurrent condition, cause the gate driver to pull the gate drive signal to a reference voltage until an end of the overvoltage condition; and
        in response to the overcurrent condition, cause modification of the gate drive signal by the gate driver such that subsequent pulses of the series of pulses have a second pulse width instead of the first pulse width.

6. The circuit of claim 5, wherein the control circuitry, when causing modification of the gate drive signal, causes modification of the gate drive signal such that the subsequent pulses of the series of pulses have the second pulse width instead of the first pulse width for a given period of time and then revert to the first pulse width unless the overcurrent condition occurs within the given period of time, with the second pulse width being less than the first pulse width.

7. The circuit of claim 5, wherein the control circuitry monitors the current flowing between the first and second conduction terminals using a second comparator that compares a second voltage proportional to the current flowing between the first and second conduction terminals of the transistor to a second threshold voltage and deasserts its output if the second voltage is higher than the second threshold voltage.

8. The circuit of claim 7, further comprising a shunt resistor coupled between the second conduction terminal of the transistor and ground; and wherein the second voltage is produced across the shunt resistor.

9. A circuit, comprising:
a direct current (DC) supply node;
a transistor having a first conduction terminal, a second conduction terminal, and a control terminal;
a shunt resistor coupled between the second conduction terminal of the transistor and ground;
a resonant tank coupled between the DC supply node and the first conduction terminal of the transistor;
a gate driver configured to generate a gate drive signal for biasing the control terminal of the transistor to cause the transistor to conduct current through the resonant tank, the gate drive signal comprised of a series of pulses having a first pulse width;
a microcontroller configured to control the gate driver; and
overvoltage determination circuitry configured to monitor a voltage between the first and second conduction terminals of the transistor, to generate an interrupt when the voltage between the first and second conduction terminals exceeds a threshold voltage, and to cause the gate driver to pull up the gate drive signal when the voltage between the first and second conduction terminals exceeds the threshold voltage to thereby stop the transistor from being in an overvoltage condition;
wherein the microcontroller is configured to, in response to receipt of the interrupt, cause modification of the gate drive signal by the gate driver such that the series of pulses subsequently have a second pulse width instead of the first pulse width.

10. The circuit of claim 9, wherein the microcontroller is configured, in a startup condition, to gradually increase the first pulse width until the interrupt is received, at which point the microcontroller causes modification of the gate drive signal by the gate driver such that the series of pulses subsequently have the second pulse width instead of the first pulse width.

11. The circuit of claim 9, wherein the microcontroller, when causing modification of the gate drive signal, causes modification of the gate drive signal such that the series of pulses subsequently have the second pulse width instead of the first pulse width for a given period of time and then revert to the first pulse width unless the interrupt is received.

12. The circuit of claim 9, wherein the overvoltage determination circuitry comprises a first comparator that compares a first voltage proportional to the voltage between the first and second conduction terminals of the transistor to the threshold voltage, and asserts an output of the first comparator if the first voltage is more than the threshold voltage.

13. The circuit of claim 12, wherein further comprising a voltage divider coupled between the first conduction terminal of the transistor and ground; and wherein the first voltage is produced at a tap of the voltage divider.

14. The circuit of claim 9, further comprising a secondary conductor magnetically coupled to the resonant tank such that when the current is conducted through the resonant tank, eddy currents are induced in the secondary conductor.

15. The circuit of claim 9, wherein the transistor comprises an insulated-gate bipolar transistor; wherein the first conduction terminal comprises a collector; wherein the second conduction terminal comprises an emitter; and wherein the control terminal comprises a gate.

16. The circuit of claim 9, further comprising a bridge rectifier configured to convert a received alternating current (AC) signal to an AC current, and a LC filter receiving the AC current and generating therefrom a DC voltage at the DC supply node.

17. A circuit, comprising:
a direct current (DC) supply node;
a transistor having a first conduction terminal, a second conduction terminal, and a control terminal;
a shunt resistor coupled between the second conduction terminal of the transistor and ground;
a resonant tank coupled between the DC supply node and the first conduction terminal of the transistor;
a gate driver configured to generate a gate drive signal for biasing the control terminal of the transistor to cause the transistor to conduct current through the resonant tank, the gate drive signal comprised of a series of pulses having a first pulse width;
a microcontroller configured to control the gate driver, the microcontroller including an analog to digital converter for receiving input; and
overcurrent determination circuitry configured to monitor a current flowing between the first and second conduction terminals of the transistor and to cause the gate driver to pull the gate drive signal to a reference voltage when the current flowing between the first and second conduction terminals exceeds a threshold current to thereby stop the transistor from being in an overcurrent condition;
wherein the analog to digital converter of the microcontroller is configured to read current across the shunt resistor; and
wherein the microcontroller is configured to, in response to the current across the shunt resistor as read by the analog to digital converter exceeding the threshold current, cause modification of the gate drive signal by the gate driver such that the series of pulses subsequently have a second pulse width instead of the first pulse width.

18. The circuit of claim 17, wherein the microcontroller is configured to, in a startup condition, gradually increase the first pulse width until the current across the shunt resistor as read by the analog to digital converter exceeds the threshold current, at which point the microcontroller causes modification of the gate drive signal by the gate driver such that the series of pulses subsequently have the second pulse width instead of the first pulse width.

19. The circuit of claim 17, wherein the microcontroller, when causing modification of the gate drive signal, causes modification of the gate drive signal such that the series of pulses subsequently have the second pulse width instead of the first pulse width for a given period of time and then revert to the first pulse width unless the current across the shunt resistor as read by the analog to digital converter exceeds the threshold current within the given period of time.

20. The circuit of claim 17, wherein the overcurrent determination circuitry comprises a second comparator that compares a second voltage proportional to the current flowing between the first and second conduction terminals of the transistor to a second threshold voltage and deasserts its output if the second voltage is higher than the second threshold voltage.

21. The circuit of claim 20, wherein the second voltage is produced across the shunt resistor.

22. The circuit of claim 17, further comprising a secondary conductor magnetically coupled to the resonant tank such that when the current is conducted through the resonant tank, eddy currents are induced in the secondary conductor.

23. The circuit of claim 17, wherein the transistor comprises an insulated-gate bipolar transistor; wherein the first conduction terminal comprises a collector; wherein the second conduction terminal comprises an emitter; and wherein the control terminal comprises a gate.

24. The circuit of claim 17, further comprising a bridge rectifier configured to convert a received AC signal to an alternating current (AC) current, and a LC filter receiving the AC current and generating therefrom a DC voltage at the DC supply node.

25. An induction geyser, comprising:
a fluid tank configured to retain fluid therein;
a resonant tank;
a transistor configured, under direction of a gate drive signal, to draw current through the resonant tank, resulting in generation of a changing magnetic field about the resonant tank;
wherein the resonant tank and fluid tank are positioned relative to each other such that the fluid tank is within the changing magnetic field of the resonant tank; and
control circuitry configured to:
monitor a voltage between first and second conduction terminals of the transistor to determine that the transistor is an overvoltage condition when the voltage between the first and second conduction terminals exceeds a threshold voltage; and
in response to the overvoltage condition, cause a gate driver pull up the gate drive signal.

26. The induction geyser of claim 25, wherein the control circuitry is further configured, in response to the overvoltage condition, to reduce a pulse width of subsequent pulses of the gate drive signal.

27. The induction geyser of claim 26, wherein the control circuitry reduces the pulse width of the subsequent pulses of the gate drive signal for a given period of time and thereafter reverts to a non-reduced pulse width unless the overvoltage condition occurs made during the given period of time.

28. The induction geyser of claim 25, wherein the transistor comprises an insulated-gate bipolar transistor having a collector coupled to the resonant tank, an emitter, and a gate biased by the gate drive signal.

29. An induction geyser, comprising:
a fluid tank configured to retain fluid therein;
a resonant tank;
a transistor configured to, under direction of a gate drive signal, draw current through the resonant tank, resulting in generation of a changing magnetic field about the resonant tank;
wherein the resonant tank and fluid tank are positioned relative to each other such that the fluid tank is within the changing magnetic field of the resonant tank; and
control circuitry configured to:
monitor a current flowing between first and second conduction terminals of a transistor to determine that the transistor is in an overcurrent condition when the current flowing between the first and second conduction terminals exceeds a threshold current; and
in response to an overcurrent condition, cause a gate driver to pull the gate drive signal to a reference voltage.

30. The induction geyser of claim 29, wherein the control circuitry is further configured to, in response to the overcurrent condition, reduce a pulse width of subsequent pulses of the gate drive signal.

31. The induction geyser of claim 30, wherein the control circuitry reduces the pulse width of the subsequent pulses of the gate drive signal for a given period of time and thereafter reverts to a non-reduced pulse width unless the overcurrent condition occurs during the given period of time.

32. The induction geyser of claim 29, wherein the transistor comprises an insulated-gate bipolar transistor having a collector coupled to the resonant tank, an emitter, and a gate biased by the gate drive signal.

\* \* \* \* \*